Nov. 10, 1959 J. P. JAPEL 2,912,312
METHOD OF MAKING COMPONENTS FOR PRINTED CIRCUITS
Filed Oct. 10, 1956

INVENTOR.
JOSEPH P. JAPEL
BY Evans & Pearne
ATTORNEYS 2,912,312
Patented Nov. 10, 1959

2,912,312

METHOD OF MAKING COMPONENTS FOR PRINTED CIRCUITS

Joseph P. Japel, Cleveland, Ohio, assignor to Cleveland Metal Specialties Company, Cleveland, Ohio, a corporation of Ohio Application October 10, 1956, Serial No. 615,069

3 Claims. (Cl. 41—43)

Figure 1:
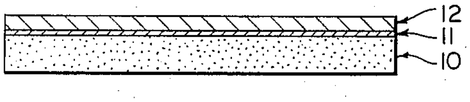

This invention relates to the production of electric circuits and parts thereof, generally known as printed circuits.

A principal purpose of the invention is to reduce the cost and improve the quality of printed circuits. A particular object of the invention is to employ in the manufacture of printed circuits a resist coating which need not itself be printed or be photosensitive.

The invention consists in one aspect in the provision of a resist coating which itself is coated with a resist. An instance of the invention comprises providing a sheet of a conductive coating such as a foil with an insulating backing, the foil being coated with a resist coating, the resist coating itself being neither printed on the metal nor photosensitive in character; defining a reverse pattern on such resist by utilizing a superimposed secondary resist coating; depositing additional conducting material on the patterned areas of the conducting coating and then removing the balance of the resist coatings and removing the reverse pattern areas of the metal as by etching.

The additional conductive material may be a plating of solder which will serve to greatly increase the solderability of the circuit in hand-soldering or dip-soldering components to the conductors.

It will be noted that the invention is to be contrasted with the prior art wherein the resist coating applied to the metal foil to insulate the same against chemical action must be printable by one or the other of the techniques of the printing arts (including the photoprinting arts) thereby necessitating relatively high costs in the provision of a coating which is at one time both capable of adequately protecting the basic foil and inherently subject to the imposition of a differentiation into conductive and non-conductive areas through printing techniques. According to the present invention, this is rendered unnecessary since the pattern-defining differentiation occurs in an additional medium which itself need not meet the relatively high standards of a medium which is to be in protective association with the foil itself.

Further, through the use of the additional medium or secondary resist, sharper detail and better definition of the circuit may be achieved.

The objects and advantages of the invention and the subject matter of the invention will be more descriptively referred to in the following exposition of typical instances of the invention. This exposition is given only by way of example.

In the drawings:

Figure 1 is a schematic cross-section of a foil or conductive coating medium which is supported on a backing and provided with an on-surface coating of a first medium or resist, all of which is appropriate to the practice of the present invention.

The contents of Figures 2 to 6 are similar to that of Figure 1, but these latter figures illustrate succeeding stages in one example of the practice of the invention.

Figure 1A:
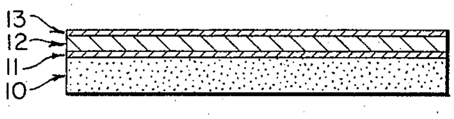
Figure 4:
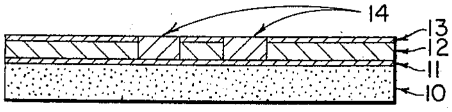
Figure 4A:
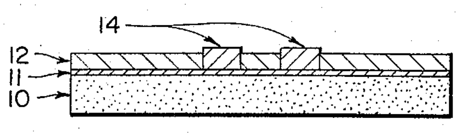

Figures 1A and 4A are supplemental in nature and are again similar in content to Figure 1. These Figures 1A and 4A pertain to procedural subject matter which may succeed that of Figures 1 and 4, respectively.

It will be understood that the drawings are highly schematic and that the respective thicknesses of the films and layers or deposits shown therein are not intended to be to scale.

As used herein the term "foil" is to be understood as including various conductive coatings or layers such as calendered or beaten metal foil, metal film, vapor deposit, sprayed metal, cathode sputtered metal, flowed-on low melting point alloy, electrochemical metallic deposition, and graphite deposition.

According to the invention, there may be provided an insulating backing 10 comprising any suitable material or composite material, a number of which are well known in the art. A foil 11 is supported on the backing. There is utilized in the practice of the invention, a primary resist or first medium 12 and a secondary resist or second medium 13.

Figure 2:
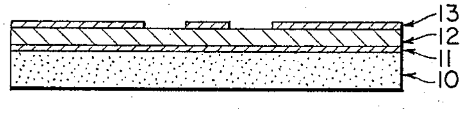

In one example of the invention, the base 10 comprises a stock insulating board and the foil 11 comprises copper. The primary resist 12 comprises an acid-resistant asphaltum (Figure 1). The primary resist 12 is coated with a secondary resist 13 which comprises a coating of bichromated photosensitive hot glue together with an extender such as glycerine which makes the coating more elastic and pliable. The coating is uniformly applied to the resist 12 and is dried (Figure 1A). The assembly with the primary and secondary resists 12 and 13 thereon is exposed to light through a film or plate, and the light affects the portions of the secondary resist which are the reverse of the desired final conductive pattern. Obviously there may alternatively be employed according to the invention secondary resists where the light affects the portions of the secondary resist which correspond to the desired final conductive pattern. After exposure to light, the assembly is subjected to the action of a first reagent which in the particular example may be merely water, the unexposed (or exposed) areas of the secondary resist being soluble in the water and the reverse areas being insoluble. The arrangement is such that the secondary resist is washed away in those areas corresponding to the desired conductive pattern (Figure 2).

The secondary resist in the reverse of the desired pattern may be applied in other ways as by printing the same directly by the use of a lithographic press or by transfers, or other printing means, and no first reagent, as such, is employed in these cases. In such cases, the stage illustrated in Figure 1A would not form part of the stages to be illustrated as succeeding one another in the practice of the invention.

Figure 3:
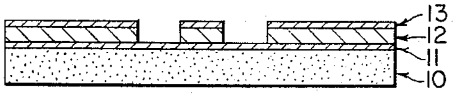

After the secondary resist pattern is applied as set forth above, the primary resist is subjected to a second reagent which in the particular example may be a suitable solvent, such as mineral spirits, kerosene, or other petroleum solvent, or it may be another type of solvent, such as carbon tetrachloride or the like, leaving the foil 11 exposed in the areas of the desired conductive pattern (Figure 3). Of course, should the primary resist itself be reactive to the first reagent, a second reagent would not have to be applied at this stage.

The exposed foil then receives the additional conductive matter 14 which may be a solder coating which is electroplated on the foil by procedures which will be familiar to the art, the primary resist serving as a resist or stop-off to the depositing of the matter 14 in the areas reversed from the desired pattern (Figure 4).

Figure 5:
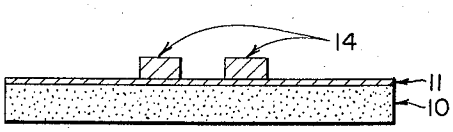

The secondary and primary resists 13 and 12 are then removed by subjecting them, respectively, to the action of a third reagent and the second reagent (Figures 4A and 5). In the particular example of the invention, the third reagent may be caustic soda which dissolves the lighthardened glue forming the secondary resist 13. As previously mentioned, the second reagent is preferably a petroleum solvent, several examples having been given above.

Of course, if the primary resist 12 were reactive with the third reagent then it would be unnecessary to employ the second reagent at this point (or the first reagent if the primary resist were reactive therewith) and the stage illustrated in Figure 4A would represent only a highly transitory condition less distinctly forming a part of the succession of illustrated stages in the practice of the invention.

Figure 6:
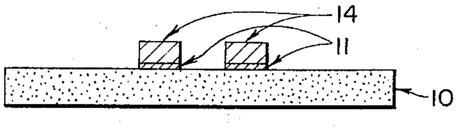

The foil remaining on the areas reversed from the desired pattern is then etched away by applying a fourth reagent (Figure 6). In the particular example, the fourth reagent may be chromic acid containing a small percentage of sulfuric acid, to which the solder plating is resistant.

According to the invention as disclosed above, additional conductive matter 14 is to be deposited on the foil and this matter may be itself essentially a resist to the fourth reagent. The primary resist or first medium is essentially inert with respect to this additional conductive matter and operates as a resist to the application or deposition thereof.

In the above example, several reagents are employed, comprising first, second, third and fourth reagents. The primary resist is essentially inert with respect to the first reagent and is reactive with, as by being soluble in, the second reagent. The secondary resist is capable, as by photosensitivity, of being selectively rendered reactive or unreactive with (for example, by being capable of being rendered insoluble in) the first reagent, as by light exposure and may be reactive with the third reagent. It is a resist or stop-off to the second reagent. However, if the primary resist is not inert with respect to the first reagent, then the second reagent may be eliminated.

Accordingly, the sequence of steps and employment of specific reagents as given above in detail is presently preferred, but it will be obvious that the broader aspects of the invention are not limited thereto. By way of additional example, it may be that the reagent which removes the foil or conductive coating 11 will also remove one or both of the primary and secondary resists so that progression from the condition shown in Figure 4 to that in Figure 6 occurs in a single transition.

It will also be understood that in its broader aspects the invention otherwise is not necessarily limited to all the particulars set forth above. For example, the foil 11 may comprise aluminum rather than copper and the deposited matter 14 may comprise a solder which can be plated on aluminum or the aluminum may be primed to cause it to readily unite with a solder of which the deposited matter 14 is comprised. Accordingly, the scope of the invention is not necessarily limited to all the details of the present disclosure but is to be defined by the following claims.

What is claimed is:

1. A method of manufacturing a component of an electric circuit involving a conductive pattern which comprises providing a sheet of metal foil with an insulating backing and an on-surface coating of a first medium which protects the foil from chemical action, printing on the surface of the first medium a representation of the reverse of the conductive pattern of the component in a second medium adherent to said first medium and protecting it from chemical action on the areas reversed from said pattern, subjecting the first medium to a chemical action utilizing the differentiation resulting from the imprint to produce a corresponding differentiation within the first medium and then subjecting the metal foil to a chemical action utilizing said corresponding differentiation to produce a differentiation of conductive and non-conductive parts of the metal foil.

2. A method according to claim 1 wherein the last-mentioned step comprises the depositing of additional conductive material on the foil on the areas of said pattern and the subsequent removal of the first medium and the foil on the areas reversed from said pattern.

3. A method according to claim 2 wherein the depositing is accomplished electrochemically.

References Cited in the file of this patent

UNITED STATES PATENTS

| | | |
|---|---|---|
| 2,443,119 | Rubin | June 8, 1948 |
| 2,666,008 | Enslein et al. | Jan. 12, 1954 |
| 2,728,693 | Cado | Dec. 27, 1955 |

OTHER REFERENCES

"Modern Plastics" for January 1952, pp. 114 and 115, article on Printed Circuits